United States Patent
Shigetomi et al.

(10) Patent No.: US 10,504,757 B2
(45) Date of Patent: Dec. 10, 2019

(54) SUBSTRATE PROCESSING APPARATUS AND METHOD OF ADJUSTING SUBSTRATE PROCESSING APPARATUS

(71) Applicant: Tokyo Electron Limited, Tokyo (JP)

(72) Inventors: Kenichi Shigetomi, Koshi (JP); Takeshi Saikusa, Koshi (JP); Eiichi Sekimoto, Koshi (JP); Takayuki Fukudome, Koshi (JP); Kousuke Yoshihara, Koshi (JP); Suguru Enokida, Koshi (JP); Kazuhiro Takeshita, Koshi (JP); Kazuto Umeki, Hsin-Chu (TW)

(73) Assignee: Tokyo Electron Limited, Minato-Ku (JP)

( * ) Notice: Subject to any disclaimer, the term of this patent is extended or adjusted under 35 U.S.C. 154(b) by 265 days.

(21) Appl. No.: 15/378,595

(22) Filed: Dec. 14, 2016

(65) Prior Publication Data

US 2017/0170040 A1 Jun. 15, 2017

(30) Foreign Application Priority Data

Dec. 15, 2015 (JP) ................. 2015-244491

(51) Int. Cl.
*H05B 1/02* (2006.01)
*H01L 21/00* (2006.01)
*H01L 21/67* (2006.01)

(52) U.S. Cl.
CPC .. *H01L 21/67248* (2013.01); *H01L 21/67103* (2013.01); *H05B 1/0233* (2013.01); *H05B 2203/037* (2013.01)

(58) Field of Classification Search
CPC ........ H01L 21/67248; H01L 21/67103; H05B 1/0233; H05B 2203/037; H05B 2203/005; H05B 2203/007; H05B 3/0047
(Continued)

(56) References Cited

U.S. PATENT DOCUMENTS 6,259,072 B1 * 7/2001 Kinnard ............ H01L 21/67115
                                                    118/725
7,755,003 B2 7/2010 Ookura et al.
(Continued)

FOREIGN PATENT DOCUMENTS

JP  2003-051439 A1  2/2003
JP  4391518 B2  12/2009

OTHER PUBLICATIONS

Japanese Office Action (Application No. 2015-244491) dated Aug. 28, 2018 (with English translation).

*Primary Examiner* — Mark H Paschall
(74) *Attorney, Agent, or Firm* — Burr & Brown, PLLC

(57) ABSTRACT

A substrate processing apparatus includes plural heating modules each including a table on which a substrate is placed to be heated, the substrate having plural heated zones. The table has plural heaters each assigned to heat respective ones of the heated zones. Heat generation of the heaters is controlled independently. A control unit controls the heaters such that integrated quantities of heat of the respective heated zones given by the corresponding heaters from first to second time point are substantially identical to each other in each of the heating modules, and are substantially identical to each other among the heating modules. The first time point is set when a temperature transition profile of the substrate is rising toward a process temperature after placing the substrate on the table under a condition where heat generation of the heaters is stable. The second time point is set after the temperature transition profile reaches the process temperature.

4 Claims, 13 Drawing Sheets

(58) Field of Classification Search
USPC .......... 219/492, 497, 483–487; 118/724, 725; 156/345.52
See application file for complete search history.

(56) References Cited

U.S. PATENT DOCUMENTS

| | | | |
|---|---|---|---|
| 8,633,423 B2* | 1/2014 | Lin | H01L 21/67109 156/345.52 |
| 2010/0078424 A1* | 4/2010 | Tsukamoto | C23C 16/4586 219/444.1 |
| 2013/0112680 A1* | 5/2013 | Moritz | H01L 21/67109 219/385 |
| 2015/0211122 A1* | 7/2015 | Chang | C23C 16/4586 156/345.27 |

* cited by examiner

| SECOND ADJUSTMENT OFFSET VALUES | | | | | |
|---|---|---|---|---|---|
|  | 1ch | 2ch | 3ch | ------------ | 11ch |
| $\Delta t_1$ | $\alpha 11$ | $\alpha 12$ | $\alpha 13$ | ------------ | $\alpha 111$ |
| $\Delta t_2$ | $\alpha 21$ | $\alpha 22$ | $\alpha 23$ | ------------ | $\alpha 211$ |
| $\Delta t_3$ | $\alpha 31$ | $\alpha 32$ | $\alpha 33$ | ------------ | $\alpha 311$ |
| ⋮ | ⋮ | ⋮ | ⋮ | ⋮ | ⋮ |
| $\Delta t_n$ | $\alpha n1$ | $\alpha n2$ | $\alpha n3$ | ------------ | $\alpha n11$ |

PROCESSING ADJUSTMENT OFFSET VALUES

|        | 1ch    | 2ch    | 3ch    | - - - - - - - - - | 11ch    |
|--------|--------|--------|--------|-------------------|---------|
| $\Delta t_1$ | $\beta 11$ | $\beta 12$ | $\beta 13$ | - - - - - - - - - | $\beta 111$ |
| $\Delta t_2$ | $\beta 21$ | $\beta 22$ | $\beta 23$ | - - - - - - - - - | $\beta 211$ |
| $\Delta t_3$ | $\beta 31$ | $\beta 32$ | $\beta 33$ | - - - - - - - - - | $\beta 311$ |
| ⋮      | ⋮      | ⋮      | ⋮      | ⋮                 | ⋮       |
| $\Delta t_n$ | $\beta n1$ | $\beta n2$ | $\beta n3$ | - - - - - - - - - | $\beta n11$ |

63  6

SUBSTRATE PROCESSING APPARATUS AND METHOD OF ADJUSTING SUBSTRATE PROCESSING APPARATUS

CROSS-REFERENCE TO RELATED APPLICATIONS

This application is based upon and claims the benefit of priority from Japanese Patent Application No. 2015-244491, filed on Dec. 15, 2015, the entire contents of which are incorporated herein by reference.

BACKGROUND OF THE INVENTION

Field of the Invention

The present invention relates to a substrate processing apparatus comprising a plurality of heating modules each including a table on which a substrate is placed to be heated, and a method of adjusting the substrate processing apparatus.

Background Art

In a semiconductor manufacturing process, a coating film is formed on a substrate such as a semiconductor wafer (referred to as "wafer" below), and then the substrate is placed on a table provided therein with a heater so as to be subjected to a heating process. The heating process may be a process in which a resist film formed on a substrate is heated at a temperature of about, e.g., 100° C. before and after exposure. The line width of a resist pattern varies depending on various factors. One of such factors is a heating temperature during the heating process.

Since solubility of resists to developers is more likely to depend on the resist temperature histories in these days, the temperature history differences between portions of one wafer and between wafers have greater influences on in-plane uniformity and inter-wafer uniformity of the line width of resist pattern.

A heating module that performs a heating process by using a plurality of heaters each assigned to respective ones of heated zones (which are defined by dividing the surface of one wafer into a plurality of zones). Heat generation of the heaters is controlled independently from each other. A known method of controlling parameters of a heater control system as described in Japanese Patent No. JP4391518B measures temperatures of a table (heating plate) at a plurality of measurement points, and controls heaters such that the measured temperatures correspond to respective target temperatures. However, in order to cope with a process that requires stricter line width uniformity, improvement of the control method will be required.

A resist-pattern forming apparatus includes a plurality of heating modules in order to process a plurality of wafers at the same time. Therefore, not only the in-plane temperature-history uniformity in each wafer, but also the inter-plane temperature-history uniformity of wafers processed by different heating modules is required.

SUMMARY OF THE INVENTION

The object of the present invention is to provide a technique enabling a heating process that provides not only excellent in-plane uniformity of a substrate but also excellent inter-plane uniformity of substrates.

In one embodiment of the present invention, there is provided a substrate processing apparatus including: a plurality of heating modules each including a table on which a substrate is placed to be heated, the substrate having a plurality of heated zones, the table having a plurality of heaters each assigned to heat respective ones of the heated zones, wherein heat generation of the heaters can be controlled independently from each other; and a control unit that outputs control signals that controls the heaters such that integrated quantities of heat of the respective heated zones given by the corresponding heaters from a first time point to a second time point are substantially identical to each other in each of the heating modules, and are substantially identical to each other among the heating modules; wherein the first time point is a time point at which a temperature transition profile of the substrate is rising toward a process temperature after the substrate is placed on the table under a condition where heat generation of the heaters are stable, and the second time point is a time point after the temperature transition profile reaches the process temperature.

In another embodiment of the present invention, there is provided a method of adjusting heat generation of heaters in a substrate processing apparatus, wherein the substrate processing apparatus includes a plurality of heating modules each including a table on which a substrate is placed to be heated, the table having a plurality of heaters whose heat generation can be controlled independently from each other, adjusting units that each output a control signal that controls electric power supplied to the corresponding heater based on a deviation of a detected temperature from a set temperature, and adding units that each add a target temperature and an offset value to obtain the set temperature. The method including: a first step that: places an adjustment substrate on the table under conditions that heat generation of the heaters are stable and that the offset values assigned to the heaters are set to zero; and detects temperatures of heated zones of the adjustment substrate by means of temperature sensors disposed in the adjustment substrate, thereby to obtain temperature transition profiles of the adjustment substrate; a second step that: calculates, based on the temperature transition profiles, integrated quantities of heat of each of the heated zones in each of time sections, the time sections being defined by dividing a time period from a first time point to a second time point; calculates averages of the integrated quantities of heat of the heated zones in the respective time sections; calculates the difference of the integrated quantity of heat from the average of the integrated quantities of heat in each of the heated zones in each of the time sections; and determines each of the differences as the offset values of the respective ones of the heated zones in respective ones of the time sections, wherein the first time point is a time point at which a temperature transition profile of the substrate is rising toward a process temperature, and the second time point is a time point after the temperature transition profile reaches the process temperature; a third step that performs a step which is the same as the first step except that the offset values obtained by the second step are used, and performs a step which is the same as the second step, thereby to obtain offset values, wherein the third step is performed at least once; and a fourth step that: performs a step, which is the same as the first step except that the offset values obtained by the third step are used, thereby to obtain temperature transition profiles; calculates, based on that temperature transition profiles, integrated quantities of heat from a predetermined time point after the adjustment substrate is placed on the table to a time point at which the adjustment substrate is removed from the table in each of the heated zones; calculates a difference of the integrated quantity of heat in each of the heated zone from a reference integrated quantity of heat commonly assigned to the heated zones; and determines each of the differences as the offset values of the respective ones of the heated zones.

According to the foregoing embodiments of the present invention, the integrated quantities of heat of the respective heated zones of one substrate heated by the corresponding heaters are substantially identical to each other in each of the heating modules, and are substantially identical to each other among the heating modules. Thus, the heating process achieves excellent in-plane uniformity in each substrate and inter-plane uniformity among substrates.

DESCRIPTION OF THE EMBODIMENTS

Figure 1:
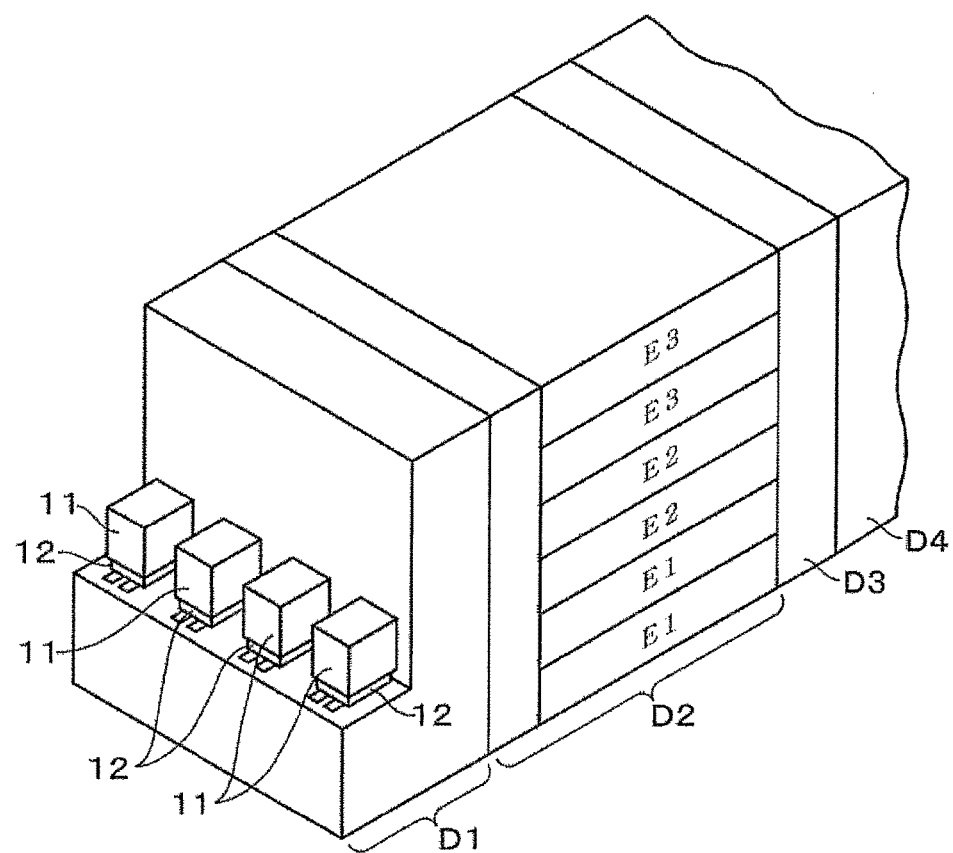
FIG. 1 is a perspective view of a coating and developing apparatus.

A coating and developing apparatus 1 according to an embodiment of a substrate processing apparatus of the present invention is described with reference to the schematic perspective view of FIG. 1. The coating and developing apparatus 1 is formed by horizontally, linearly connecting a carrier block D1, a processing block D2 and an interface block D3 in this order. A direction along which the blocks D1 to D3 are arranged is a back and forth direction. An exposure apparatus D4 is connected to the interface block D3 on the side opposed to the processing block D2.

The carrier block D1 is provided with tables 12 on which carriers 11 are respectively placed. Each of the carriers 11 contains a plurality of wafers W that are circular substrates. The processing block D2 includes two unit blocks E1, two unit blocks E2 and two unit blocks E3. The unit blocks E1 to E3 are stacked on one another. A wafer W is transferred to one of the same two unit blocks E so as to be processed.

The unit block E1 is a block for forming an antireflection film, which applies a chemical liquid for forming an anti-reflection film to a wafer W, and heats the wafer W with the chemical liquid applied thereto. The unit block E2 is a block for forming a resist film, which applies a resist to a wafer W, and heats the wafer W with the resist applied thereto. The unit block E3 is a block for forming a resist pattern on a wafer W, which heats a wafer W with a resist film having been exposed by the exposure apparatus D4 along a predetermined pattern, and supplies the heated wafer W with a developer. The heating process performed by the unit block E3 is to remove standing waves after exposure, which process is referred to as post exposure bake (PEB), or to conduct a chemical reaction at an exposed position when the resist is a chemically amplified resist.

Each of the blocks D1 to D3 is equipped with a transfer mechanism for a wafer W. A wafer W in the carrier 11 is transferred therefrom to the carrier block D1, the unit block E1, the unit block E2, the interface block D3, the exposure apparatus D4, the interface block D3 and the unit block E3, in this order, and is subjected to the aforementioned respective processes so that a resist pattern is formed on the wafer W. Thereafter, the wafer W is transferred to the carrier block D1 and is returned to the carrier C.

Figure 2:
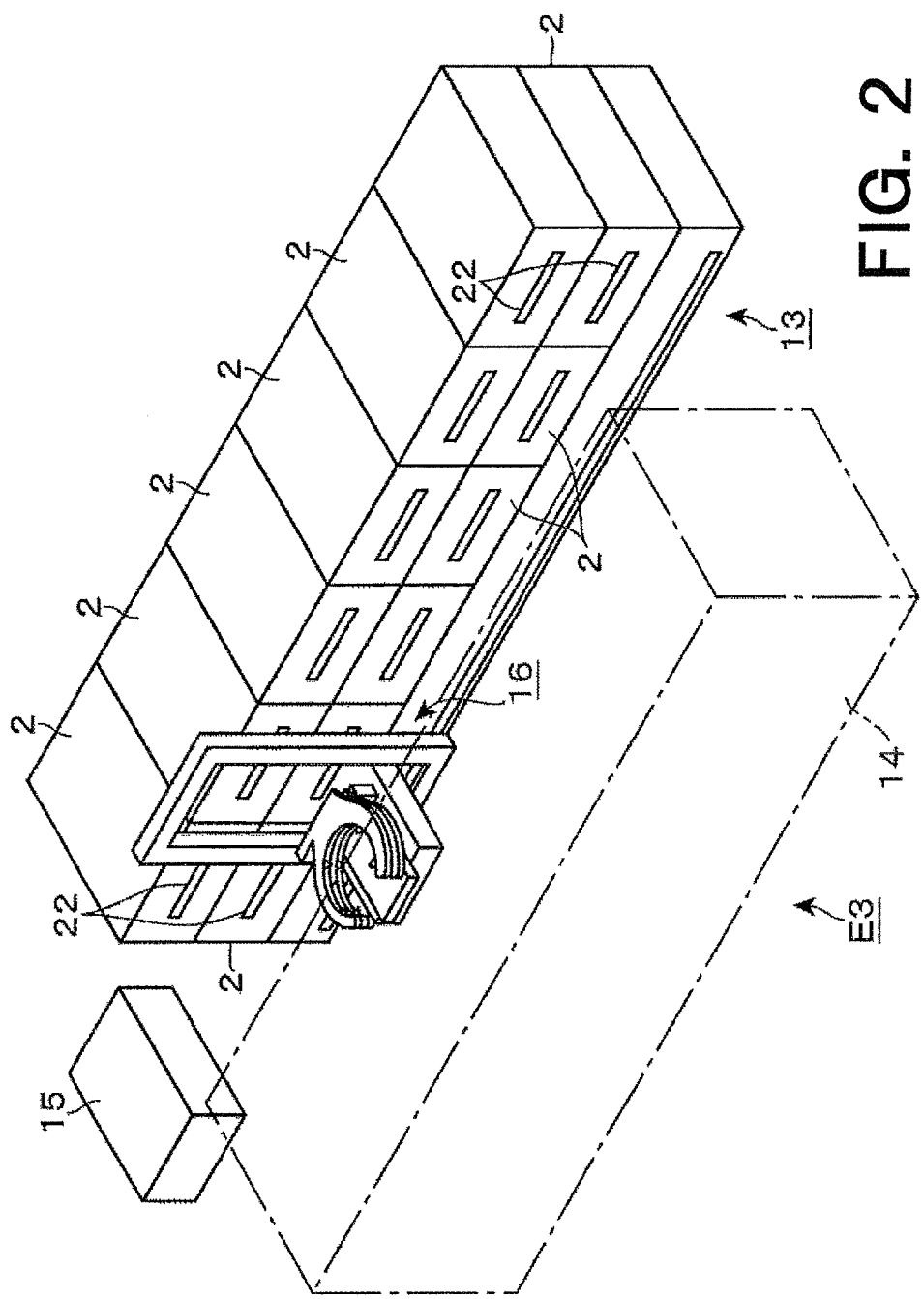
FIG. 2 is a perspective view of processing blocks of the coating and developing apparatus.

FIG. 2 is a perspective view showing the unit block E3. 13 in FIG. 2 depicts a transfer path of a wafer W, which extends in the back and forth direction. A plurality of heating modules 2 each performs the aforementioned PEB are disposed on one side of the right and left sides of the transfer path 13. The heating modules 2 are arranged along the back and forth direction and the up and down direction, respectively, like a matrix. A developing module 14, which supplies a developer to a wafer W having been subjected to PEB, is disposed on the other side of the right and left sides of the transfer path 13. 15 depicts a delivery module on which a wafer W is placed, in order that the wafer W is delivered to the carrier block D1.

Reference numeral 16 depicts a transfer mechanism of a wafer W, which transfers a wafer W among the delivery module 15, the developing module 14, the heating module 2 and the interface block D3. A wafer W, which has been carried by the transfer mechanism 16 from the interface block D3 into the unit block E3, is transferred to any one of the heating modules 2 and is processed there. As described below, due to the setting of parameters, each heating module 2 is configured to achieve excellent in-plane uniformity in resist pattern of a wafer W, and excellent inter-plane uniformity in resist pattern of wafers W.

Figure 3:
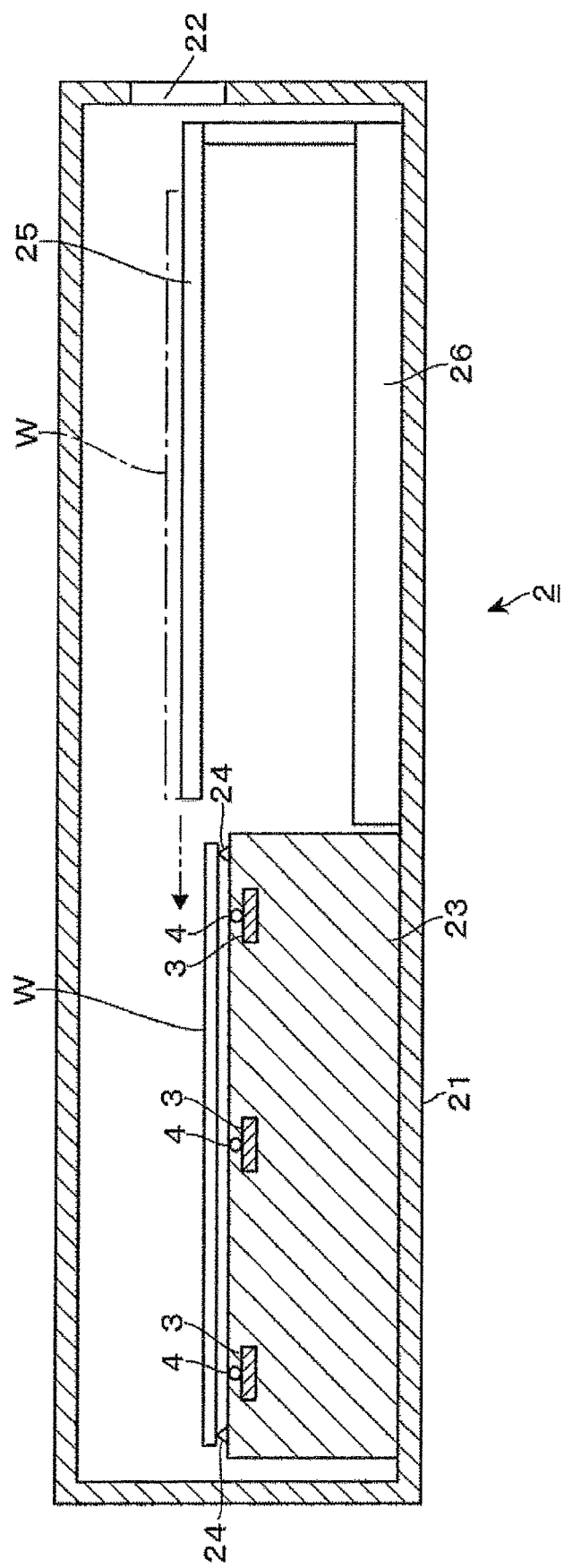
FIG. 3 is a vertical sectional view of a heating module provided in the processing block.

FIG. 3 is a vertical sectional view of the heating module 2. The heating module 2 has a housing 21. Reference numeral 22 depicts a transfer port of a wafer W formed in the housing 21. Reference numeral 23 depicts a horizontal heating plate whose surface is heated. Reference numeral 24 depicts a plurality of support pins provided on the surface of the heating plate 23. A wafer W is placed on the support pins 24 to be heated while leaving a slight gap between the wafer W and the heating plate. Reference numeral 25 depicts a cooling plate for cooling a heated wafer W placed thereon. The cooling plate 25 is horizontally moved by a moving mechanism 26 between a waiting position outside the heating plate 23 (shown in FIG. 3), and a position above the heating plate 23, in order to transfer a wafer W between the transfer mechanism 16 of the unit block E3 and the heating plate 23. The transfer mechanism 16 is vertically moved relative to the cooling plate 25 at the waiting position, in order that a wafer W is transferred between the transfer mechanism 16 and the cooling plate 25. In addition, by means of cooperation of vertical movement of not-shown elevation pins provided in the heating plate 23 and movement of the cooling plate 16, a wafer W is transferred between the heating plate 23 and the cooling plate 25.

Figure 4:
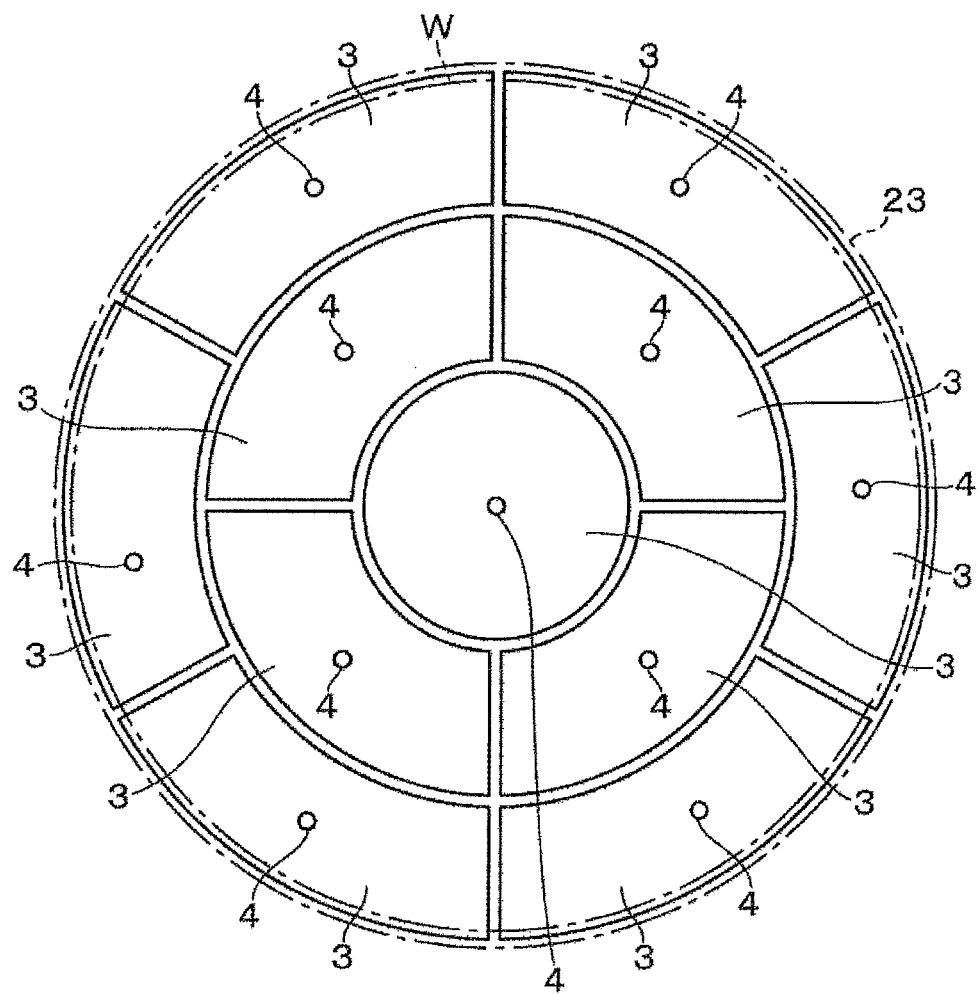
FIG. 4 is a plan view of a heating plate provided in the heating module.

The heating plate 23 serving as a table for placing a wafer W thereon is described in more detail with reference to a plan view of FIG. 4. In the heating plate 23, heaters 3 are respectively embedded in different zones in a plan view. FIG. 4 shows an example in which the heaters 3 are respectively disposed in eleven zones. In this specification, the heaters 3 are identified from one another by their channel numbers, i.e., first channel (1ch) to eleventh channel (11ch). Since heat generation of heaters 3 of 1ch through 11ch can be controlled independently from each other, temperatures of the zones respectively provided with the heaters 3 of the heating plate 23 can be independently controlled. In other words, the surface of the heating plate 23 is divided into eleven zones, and the divided zones are respectively equipped with the heaters 3 in order that temperatures of the respective divided zones can be individually controlled. Due to the structure of the heating plate 23, the temperature of a wafer W placed on the heating plate 23 is controlled such that the temperature of each divided zone corresponds to the temperature of respective ones of the heaters 3. Namely, the eleven heated zones of the wafer W respectively corresponding to the heaters 3 of 1ch through 11ch are individually heated by the respective heaters 3.

Temperature sensors 4 are respectively disposed on the divided zones of the heating plate 23. Each temperature sensor 4 detects the temperature of the corresponding heater 3 and outputs a detection signal. Thus, the sensors 4 are disposed correspondingly to the respective heated zones of a wafer W. The heater 3 of each channel and the temperature sensor 4 corresponding to the heater 3 constitute a temperature control mechanism 5 that controls the temperature of the heated zone of a wafer W corresponding to the divided zone in which this heater 3 is disposed. Namely, one heating plate 23 has eleven temperature control mechanisms 5 of 1ch through 11th channels. Herebelow, similarly to the heaters 3, the temperature control mechanisms 5, respective constituent elements included in the temperature control mechanisms 5 and the divided zones of the heating plate 23 are sometimes described with channel numbers added thereto.

Figure 5:
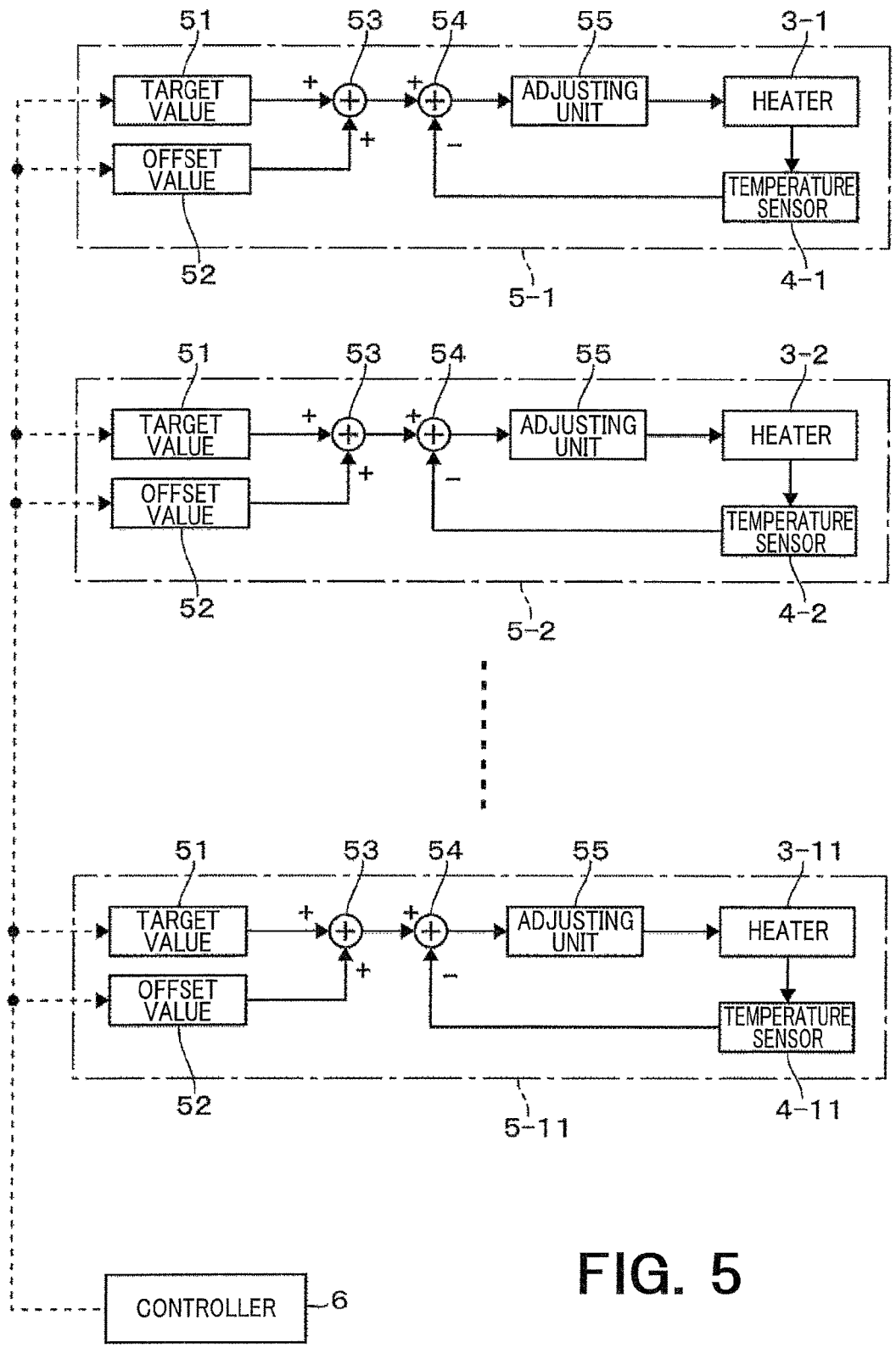
FIG. 5 is a block diagram of a control system constituting a temperature controller provided in the heating module.

FIG. 5 is a control diagram showing the structure of each temperature control mechanism 5. The numbers following to the reference numerals 3 to 5, which respectively depict the heater, the temperature sensor and the temperature control mechanism, and the hyphens mean the channel numbers. Thus, the temperature control mechanism 5 of 1ch is represented as 5-1, and the temperature control mechanism 5 of 11ch is represented as 5-11, for example. However, the channel numbers of a below-described adding unit and a below-described adjusting unit, which constitute the temperature control mechanism 5, are omitted for the sake of convenience. A controller 6 that is a computer is connected to the temperature control mechanisms 5 of 1ch through 11ch. The controller 6 transmits to the respective temperature control mechanisms 5 control signals respectively representing a target value (target temperature) of heated zones of a wafer W and offset values with respect to the target value.

The temperature control mechanism 5 of 1ch through 11ch have the same structure. The temperature control mechanism 5 of 1ch will be described as a representative. The temperature control mechanism 5 is composed of a target value outputting unit 51, an offset value outputting unit 52, a first adding unit 53, a second adding unit 54 and an adjusting unit 55, in addition to the aforementioned heater 3 and the temperature sensor 4. The target value outputting unit 51 has a register to which a wafer temperature target value (a target value of temperature of the wafer W, which has been transmitted from the controller 6, is inputted, and outputs to the subsequent unit a signal corresponding to the value inputted to the register. The offset value outputting unit 52 has a register to which an offset value, which has been transmitted from the controller 6, is inputted, and outputs to the subsequent unit a signal corresponding to the value inputted to the register.

The first adding unit 53 adds the output value from the target value outputting unit 51 and the output value from the offset value outputting unit 52, and outputs to the subsequent unit the addition value that is a set temperature of the heater 3. The second adding unit 54 adds the output value from the first adding unit 53 and a value obtained by multiplying an output value from the temperature sensor 4 by "−1", i.e., calculates a deviation of the output value from the first adding unit 53 from the output value from the temperature sensor, and outputs the computing value to the adjusting unit 55. The adjusting unit 55 calculates electric power to be supplied to the heater 3 based on the output value from the second adding unit 54 and a transfer function stored in a memory included in the adjusting unit 55, and supplies the heater 3 with the electric power value. Heat generation of the heater 3 corresponds to the electric power value thus supplied.

The wafer temperature target values transmitted from the controller 6 to the temperature control mechanisms 5 of the respective channels are the same. Offset values transmitted from the controller 6 to the temperature control mechanisms 5 of the respective channels are individually set. Offset values are set for respective time sections (Δt) in a time period during which a wafer W is subjected to a heating process, which will be described in detail later. In other words, during the heating process of a wafer W, the offset value transmitted to the temperature control mechanism 5 of each channel varies with time.

Figure 6:
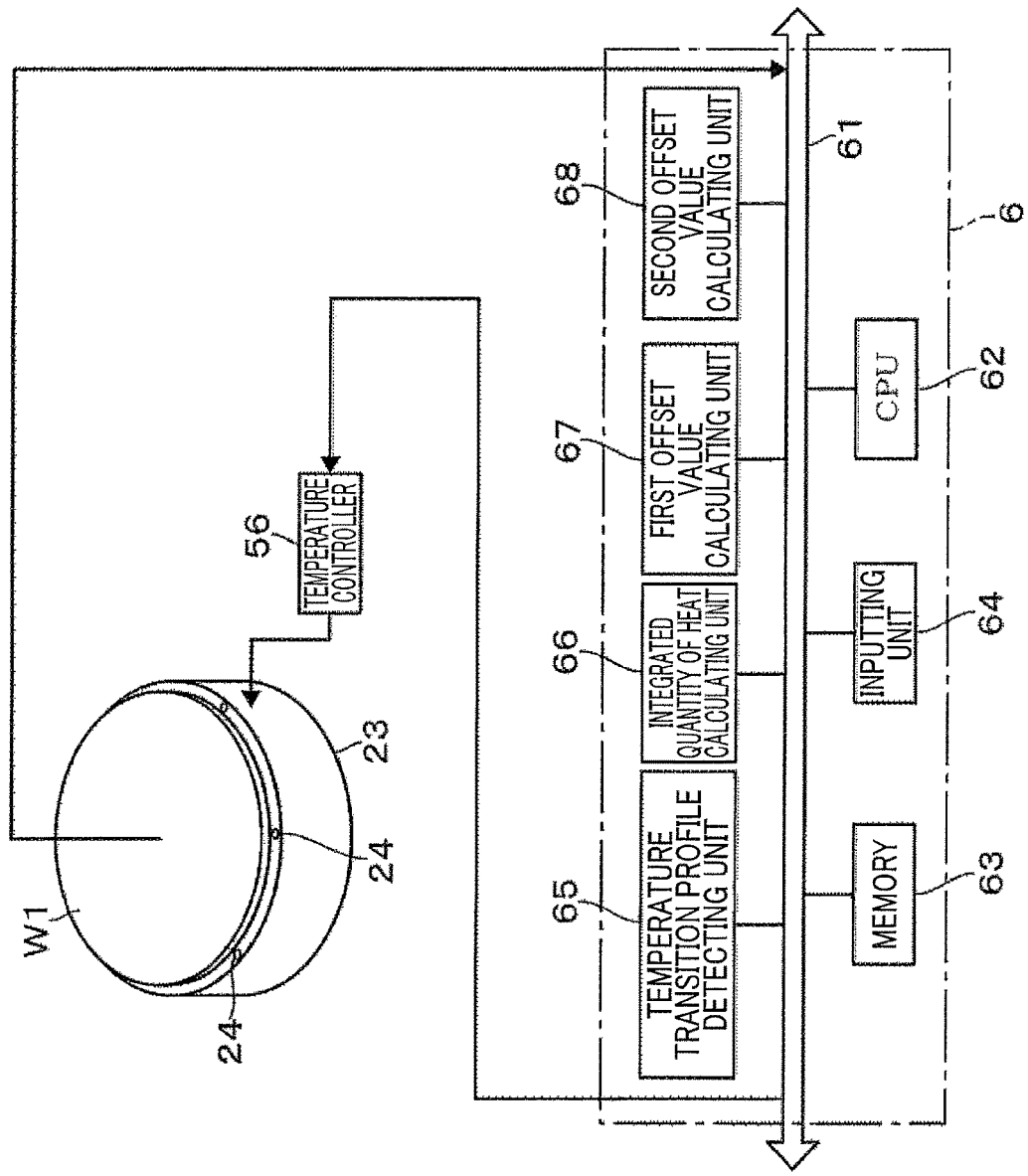
FIG. 6 is a block diagram of a controller provided in the heating module.

The target value outputting unit 51, the offset value outputting unit 52, the first adding unit 53, the second adding unit 54, and the adjusting unit 55, which are included in the temperature control mechanism 5 of each channel, constitute a temperature controller 56 shown in FIG. 6. The controller 6 and the temperature controller 56 constitute a control unit. In FIG. 6, reference sign W1 depicts an adjustment wafer used in a heating plate adjusting process for setting the aforementioned offset values as parameters. As shown in FIG. 6, in the adjusting process, the adjustment wafer W1 is placed on the heating plate 23, instead of a normal wafer W. The adjustment wafer W1 has substantially the same structure as that of a normal wafer W, except that the adjustment wafer W1 has not-shown temperature sensors in zones corresponding to the respective divided zones of the heating plate 23 (zones in which the heaters 3 are respectively disposed).

In the adjusting process, the temperature sensors of the adjustment wafer W1 are connected to the controller 6, so as to transmit to the controller 6 temperature detection signals, which are digital signals. Using the temperature detection signals, the controller 6 can detect temperatures of the zones of the adjustment wafer W1 corresponding to the divided zones of the heating plate 23, and obtain temperature transition profiles. Thus, the controller 6 can obtain eleven temperature transition profiles of 1*ch* through 11*ch* channels. The temperature transition profiles are sometimes identified by the channel numbers. Namely, for example, "temperature transition profile of 1*ch*" means a temperature transition profile obtained by the temperature sensor disposed in the heated zone of the adjustment wafer W1 heated by the heater 3 of 1*ch*. It is assumed that the temperature transition profile of the adjustment wafer W1 substantially the same as the temperature transition profile of a normal wafer W.

The controller 6 includes a CPU 62, a memory (storage unit) 63, an inputting unit 64, a temperature transition profile detecting unit 65, an integrated quantity of heat calculating unit 66, a first offset value calculating unit 67 and a second offset value calculating unit 68, which are respectively connected to a bus 61. The temperature sensors of the adjustment wafer W1 are also connected to the bus 61. The CPU 62 performs various computing operations for carrying out a below-described flow for the heating plate adjusting process. The memory 63 stores offset values set for the respective heaters 3 and for the respective time sections, which are to be transmitted to the temperature control mechanisms 5. The inputting unit 64 is composed of a mouse, a keyboard, a touch panel, etc., to allow a user of the apparatus to perform various operations to progress the flow for the heating plate adjusting process.

The temperature transition profile detecting unit 65, the integrated quantity of heat calculating unit 66, the first offset value calculating unit 67 and the second offset value calculating unit 68 may be respectively realized by computer programs that run on the computer hardware, the programs having steps for the below-described flow. These programs are installed to the controller 6 from a storage medium such as a hard disc, a compact disc, a magneto optic disc, a memory card, a flexible disc or the like.

Figure 7:
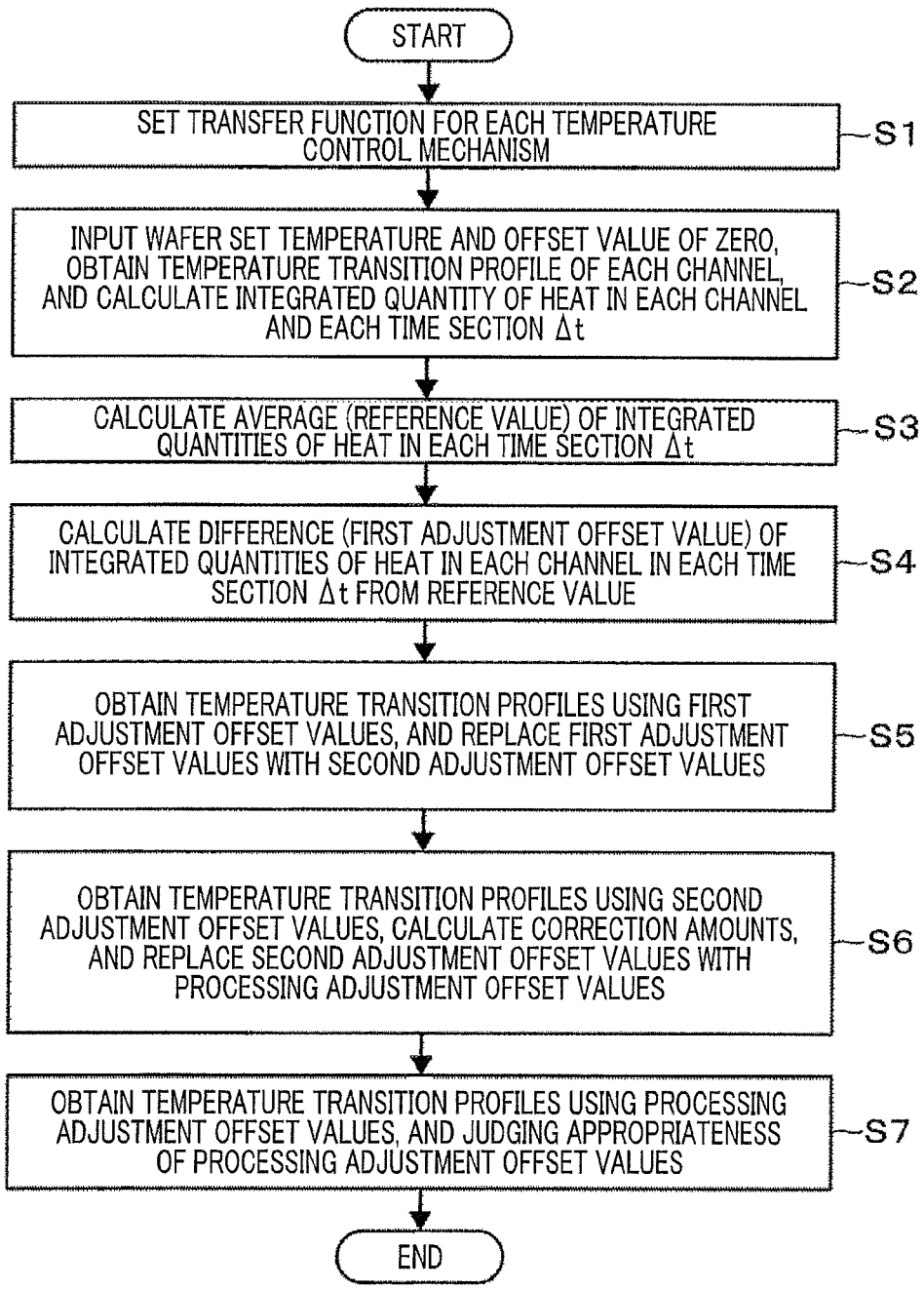
FIG. 7 is a flowchart showing an offset value setting step in which offset values assigned to the heating plates are set.

Herebelow, the heating plate adjusting process of one heating module 2 is described with reference to the flowchart of FIG. 7. As described referring to FIG. 6, a user of the apparatus places the adjustment wafer W1 onto the heating plate 23, and inputs steps inputs for the heaters 3 of 1*ch* through 11*ch*. Based on outputs from the respective temperature sensors of the adjustment wafer W1, the user obtains temperature transition profiles of 1*ch* through 11*ch*. Based on the obtained temperature transition profiles, the user calculates appropriate parameters such as a time constant, a gain and so on, which constitute transfer functions to be stored in the adjusting units 55 of the temperature control mechanisms 5, and sets the transfer functions, such that temperatures are substantially identical to each other among the channels, at predetermined time intervals in a time period when a wafer W is subjected to a heating process (step S1). To be more specific, the transfer functions are set such that, in the time period where the heating process is performed, the time points at which the rising temperatures of the wafer W of the respective channels reach a predetermined temperature (e.g., 45° C.) are substantially the same among the channels, and the wafer temperatures of the wafer W of the respective channels measured at predetermined time intervals from the aforementioned time point are substantially the same among the channels.

Figures 8, 9:
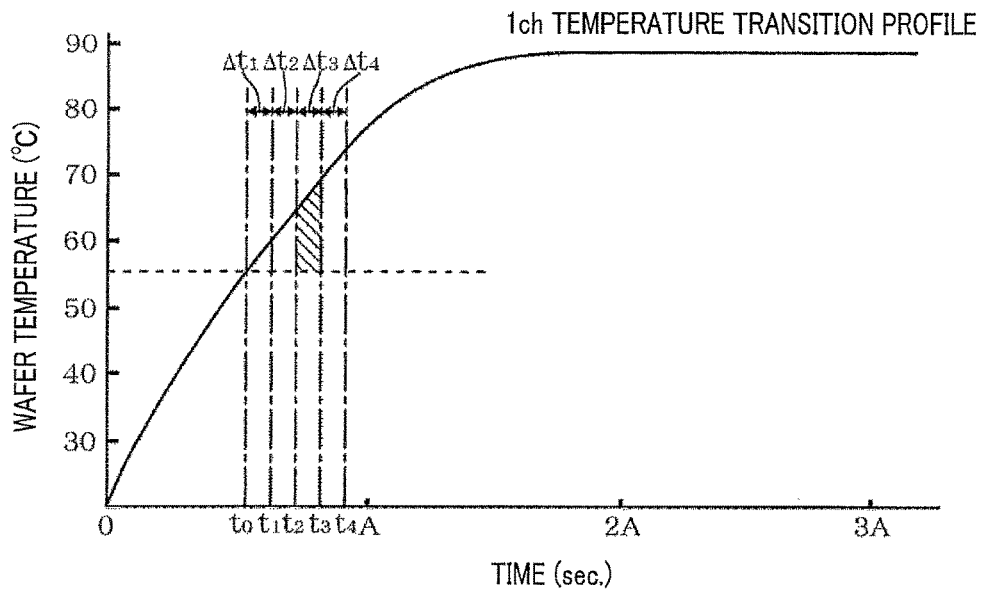
FIG. 8 is a graph showing a temperature transition profile obtained by a temperature sensor in the setting step.
FIG. 9 is a schematic diagram showing a table storing a group of second adjustment offset values assigned to the heating plate.

Thereafter, the controller 6 inputs to the temperature control mechanisms 5 of the respective channels a process temperature of the wafer W in the heating process of the wafer W, as the wafer temperature target value, while the offset values are set to zero. After the temperature of each heater 3 rises and heat generation of the heater 3 becomes stable, the adjustment wafer W1 is placed on the heating plate 23 to be heated, similarly to the heating process to the normal wafer W. Then, temperature transition profiles of 1*ch* through 11*ch* are obtained. FIG. 8 shows a graph of the temperature transition profile of 1*ch*, in one example. The horizontal axiss of the graph shows the time that has elapsed from a time point at which the adjustment wafer W1 is placed on the heating plate 23 and the heating process is started. The vertical axis of the graph shows the temperature detected by the temperature sensor of the adjustment wafer W1.

In each of the temperature transition profiles of 1*ch* through 11*ch*, for example, a time point at which the temperature rising toward the process temperature becomes a predetermined temperature such as 55° C., after a predetermined time has elapsed from when the heating of the adjustment wafer W1 was started, is set as "t0". In addition, starting from the time point t0 (referred to as "first time point"), time points t1, t2, t3, . . . , tn ("n" is a natural number) are set at time intervals "Δt". The time point "t0" to the time point "tn" are the same among the temperature transition profiles of 1*ch* through 11*ch*. The time point "tn" (referred to as "second time point") is a time point after the temperature transition profile of a wafer W reaches the process temperature. For example, the time point "tn" is a time point at which the wafer W is raised by the elevation pins from the heating plate 23 in order to lower the temperature of the wafer W and finish the heating process. The time point at which the wafer W is elevated from the heating plate 23 is a time point at which the wafer W is carried out (unloaded) from the heating plate 23. A time section between the time point "t0" and the time point "t1" is referred to as "time section Δt1", a time section between the time point "t1" and the time point "t2" is referred to as "time section Δt2", a time section between the time point "t2" and the time point "t3" is referred to as "time section Δt3", a time section between the time point "t3" and the time point "t4" is referred to as "time section Δt4", and a time section between the time point "tn−1" and the time point "tn" is referred to as "time section Δtn". For each of the temperature transition profiles of 1*ch* through 11*ch*, integrated quantities of heat in the respective time sections "Δt" are calculated (step S2).

A method of calculating an integrated quantity of heat in the time section "Δtd" ("d" may be any natural number) in one channel is described. As shown in FIG. 8 showing a temperature transition profile in one example, the integrated quantity of heat in the time section "Δtd" is determined as an area of a zone in the time section "Δtd" sandwiched by a horizontal line indicating that the temperature is a temperature at the time point "t0", and the temperature profile line. In FIG. 8, the zone corresponding to the integrated quantity of heat in the time section "Δt3" is shaded.

Following thereto, averages of the integrated quantities of heat of the respective first through eleventh channels in the respective time sections "Δt" are calculated. The averages are set as reference values of the integrated quantities of heat in the respective time sections "Δt" (step S3). Namely, in the step S3, the average of the integrated quantities of heat of the first trough eleventh channels in the time section "Δt1", an average of the integrated quantities of heat of the first trough eleventh channels in the time section "Δt2", . . . and an average of the integrated quantities of heat of the first trough eleventh channels in the time section "Δtn" are calculated.

Then, for each channel, the difference between the integrated quantity of heat in the time section "Δt" and the reference value of the integrated quantity of heat in the time section "Δt" is calculated. The difference thus calculated is determined as an offset value in the time section "Δt" in the corresponding channel. To be more specific, in the time section "Δt1", suppose that an integrated quantity of heat of 1*ch* is X1, that an integrated quantity of heat of 2*ch* is X2, and that a reference value of the section "Δ1*t*" is Y, the difference X1−Y and the difference X2−Y are calculated. The calculated difference X1−Y is set as an offset value outputted to the temperature control mechanism 5 of 1*ch* for the time section "Δt1", and the calculated difference X2−Y is set as an offset value outputted to the temperature control mechanism 5 of 2*ch* for the time section "Δt1". Offset values are set for the respective time sections "Δt" and the respective channels. A table in which the identification numbers of the channels (ch1-ch10), the identification numbers of the time sections "Δt" ("Δtd") and the offset values are related to one another, is created, and the table is stored in the memory 63 of the controller 6 (step S4).

The offset values obtained in the step S4 are used for roughly uniformizing the integrated quantity of heat in the respective zones heated by the heaters 3 of 1*ch* through 11*ch* in each time section "Δt". In order to distinguish these offset values from offset values obtained in the subsequent step, these offset values are referred to as first adjustment offset values. The subsequent step calculates, using the first adjustment offset values, offset values that can precisely uniformize the integrated quantity of heat among the channels in each time section "Δt".

After the first adjustment offset values are obtained, the adjustment wafer W1 is placed onto the heating plate 23 under the condition that heat generation of the heaters 3 is stable, so that the adjustment wafer W1 is heated, similarly to the above step S2. Temperature transition profiles of 1*ch* through 11*ch* are obtained, and integrated quantities of heat of the respective channels in each time section "Δt" are calculated. In heating of the adjustment wafer W1, the first adjustment offset values obtained in the step S4 are used. Namely, the first adjustment offset values set for the respective channels in the respective time sections "Δt" are read out from the memory 63 of the controller 6, and are transmitted to the temperature control mechanisms 5 of the respective channels. Thus, the adjustment wafer W1 is heated, while the output of the heater 3 of each channel is controlled in each time section "Δt".

Then, similarly to the above step S3, the average of the integrated quantities of heat of the first trough eleventh channels is calculated as a reference value for each time section "Δt". Thereafter, similarly to the step S4, a difference between the integrated quantity of heat of each channel and the reference value of the integrated quantity of heat in each time section "Δt" is calculated as an offset value of the corresponding channel in the corresponding time section "Δt". The newly calculated offset value is referred to as "second adjustment offset value" for the sake of convenience. Then, as shown in FIG. 9, for example, a table in which the respective numbers of the channels, the respective numbers of the time sections "Δt" and the second offset values are related to one another, is created, and the table is stored in the memory 63 of the controller (step S5). Namely, the first adjustment offset values obtained in the step S4 are replaced with the second adjustment offset values obtained in the step S5.

As described above, the second adjustment offset values are offset values for precisely uniformizing the integrated quantities of heat of the zones of a wafer W heated by the heaters 3 of 1*ch* to 11*ch* in each time section "Δt". Thus, the wafer W can be uniformly heated by using the second adjustment offset values. In other words, the heating process is carried out with improved in-plane uniformity of CD (Critical Dimension) of a resist pattern of a wafer W.

However, as described above, since the plurality of heating modules 2 are disposed in the unit block E3, there may be differences in properties among the modules. The following steps are performed for compensating the differences in properties, so that wafers W can be heated uniformly among the heating modules 2. In other words, the following steps are performed to uniformize the CD among wafers W processed in the respective heating modules 2.

Figure 10:
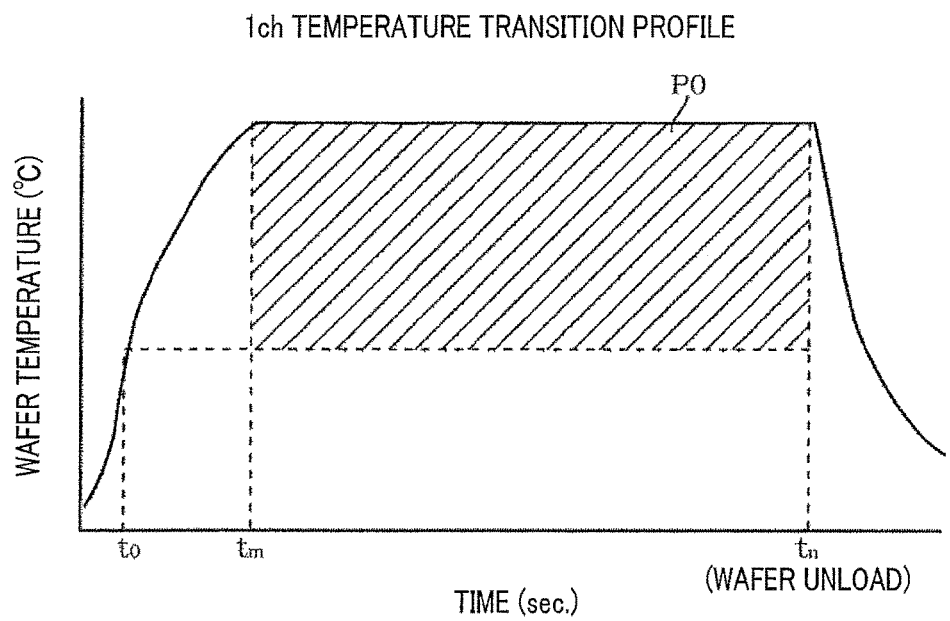
FIG. 10 is a graph showing a temperature transition profile obtained by a temperature sensor in the setting step.

After the second adjustment offset values are obtained, the adjustment wafer W1 is heated similarly to the above step S4, and temperature transition profiles of 1*ch* through 11*ch* are obtained. In heating of the adjustment wafer W1, the second offset values obtained in the step S5 are used. In each of the temperature transition profiles of 1*ch* through 11*ch*, an integrated quantity of heat from a preset time point "tm" to a preset time point "tn" (0<m<n) is obtained. A temperature transition profile of 1*ch* in one example is shown in FIG. 10, in which an area corresponding to the aforementioned integrated quantity of heat from "tm" to "tn" is shaded and is labelled "P0". For example, the time point "tm" is a time point about when temperature rising of the adjustment wafer W1 finishes and the temperature of the adjustment wafer W1 becomes stable, for example.

Figure 11:
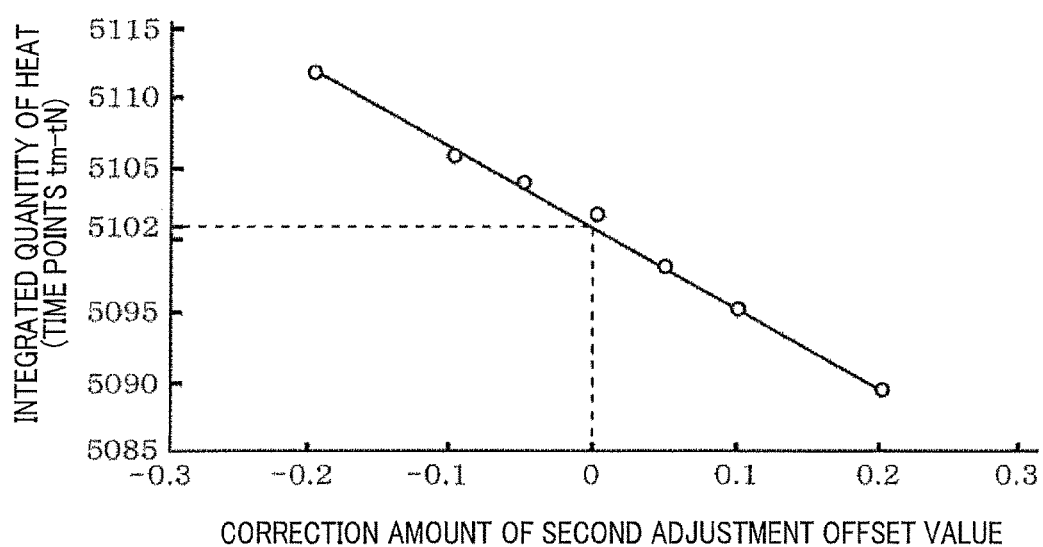
FIG. 11 is a graph showing data for calculating processing offset values from the second adjustment offset values.

After integrated quantities of heat of the respective channels from the time point "tm" to the time point "tn" are obtained, correction amounts for offset values are determined for the respective channels, based on a graph shown in FIG. 11, for example. In the graph, the vertical axis indicates the integrated quantity of heat from the time point "tm" to the time point "tn", and the horizontal axis indicates the correction amount for the offset value. As shown in the graph, the correction amount of zero corresponds to the reference integrated quantity of heat from the time point "tm" to the time point "tn" that is "5102", and the correction amount for an offset value is determined depending on the deviation of the obtained integrated quantity of heat from the reference integrated quantity of heat. It was confirmed, from the below evaluation test, that the integrated quantity of heat from the time point "tm" to the time point "tn" and the CD of the pattern are correlated to each other. Thus, the correlation between the integrated quantity of heat from the time point "tm" to the time point "tn" and the correction amount for offset value shown in this graph can be obtained by conducting an experiment beforehand.

Figures 12, 13:
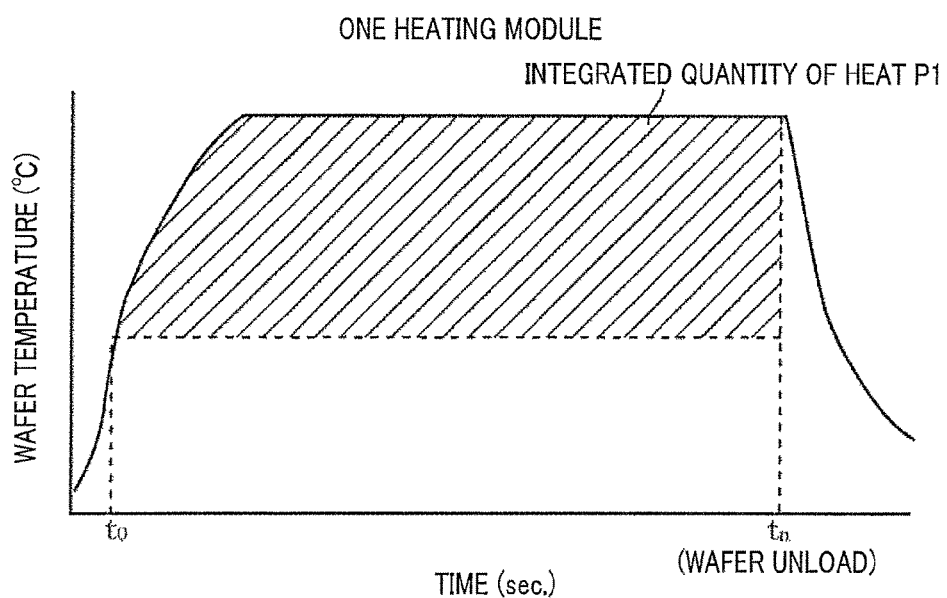
FIG. 12 is a schematic diagram showing a table storing processing offset values that are parameters for adjusting temperatures of the heating plate.
FIG. 13 is a graph showing a temperature transition profile obtained by using the processing offset values.

After correction amounts for offset values are obtained for the respective channels, the correction amounts are respectively added to the second adjustment offset values assigned to time sections "Δt1" to "Δtn", for example. Namely, a correction amount obtained for one channel is added to the respective second adjustment offset values assigned to time sections "Δt1" to "Δtn" of this channel. That is to say, the second adjustment offset values stored in the table of FIG. 9 are replaced as shown in FIG. 12. The corrected second adjustment offset values thus corrected by adding correction amounts are used as processing offset values (step S6).

Thereafter, the adjustment wafer W1 is heated similarly to the above step S5, and temperature transition profiles of 1*ch* though 11*ch* are obtained. In heating of the adjustment wafer W1, the processing offset values obtained in the step S6 are used. Then, integrated quantities of heat from the time point "tm" to the time point "tn" of the respective channel are obtained from the temperature transition profiles, and whether each integrated quantity of heat is within an allowable range or not is judged (step S7). When it is judged that the integrated quantities of heat are within the allowable range, it means that the processing offset values are appropriate, and the heating plate adjusting process is finished. If it is judged as inappropriate, it means that the processing offset value(s) is (are) inappropriate, and the adjusting process is performed again, for example, from any one of the aforementioned steps.

In the above steps, creation of temperature transition profiles by temperature detection signals from the adjustment wafer W1 is performed by a "temperature transition profile obtaining unit". Calculation of integrated quantities of heat in the respective time sections "Δt" and calculation of integrated quantities of heat from the time point "tm" to the time point "tn" based on the temperature transition profiles are performed by the "integrated quantity of heat calculating unit" 66. Calculation of the average of integrated quantities of heat in each time section "Δt" and calculation of the deviation of the integrated quantity of heat of each channel from the average in each time section "Δt" are performed by the "first offset value calculating unit" 67. Calculation of processing offset values from the graph of FIG. 11 is performed by the "second offset value calculating unit" 68.

The above description explains the adjusting process of the heating plate 23 of one of the heating modules 2. The heating plates 23 of the other heating modules 2 are also subjected to the same adjusting process. Namely, processing offset values are set for every heating module 2. In order to uniformize integrated quantities of heat among the modules, the correlationship between the integrated quantity of heat from the time point "tm" to the time point "tn" and the correction amount for the offset value which is used in the above step S6 is commonly used in, or shared by the heating plate adjusting processes of the respective modules. Namely, a common value is used in the heating plate adjusting processes of the respective modules, as the reference integrated quantity of heat ("5102" in FIG. 11) for obtaining the correction amount.

In order to uniformize the integrated quantities of heat in a plane of one wafer W and integrated quantities of heat among wafers W, it is preferable that the adjustment wafer(s) W1 used in the above steps S1 through S7 in the respective modules 2 has the same thermal properties. Thus, for example, it is preferable that a common adjustment wafer W1 is used in the above steps S1 through S7, and that a common adjustment wafer W1 is used in the heating plate adjusting processes of the respective modules. The respective zones of the adjustment wafer W1 heated by the heaters 3 of ch1 through ch11 have the same area, and made of the same material. Thus, in the above heating plate adjusting process, digital values of temperature detection signals of the adjustment wafer W1 are handled as integrated quantities of heat.

The heating process of a normal wafer (product wafer) W using the thus heating module 2 thus adjusted is performed in the same manner as the heating of the adjustment wafer W1 in the step S7 of the adjusting process, except that a normal wafer W is heated in place of the adjustment wafer W1. Namely, processing offset values set for the respective channels in the respective time sections "Δt" are read out from the table of the memory 63 of the controller 6, and are transmitted to the respective temperature control mechanisms 5. The wafer W is heated, while outputs of the heaters 3 of the respective channels are controlled in the respective time sections "Δt".

FIG. 13 shows a temperature transition profile of one of the channels, obtained by using an adjustment wafer W1 heated by one of the heating module 2 that has been subjected to the adjusting process including the steps S1 through S7. As described above, since the adjustment wafer W1 has substantially the same structure as that of a normal wafer W, it can be said that the above heat transition profile is the same as the heat transition profile of the normal wafer W. As described above, since integrated quantities of heat are uniformized among the channels in the respective time sections "Δt", temperature transition profiles of the other ten channels are substantially the same as the temperature transition profile shown in FIG. 10. In FIG. 13, the area corresponding to an integrated quantity of heat from the time point "t0" to the time point "tn" is labelled "P1". For the sake of convenience, the area P1 is referred to as an integrated quantity of heat P1.

Figure 14:
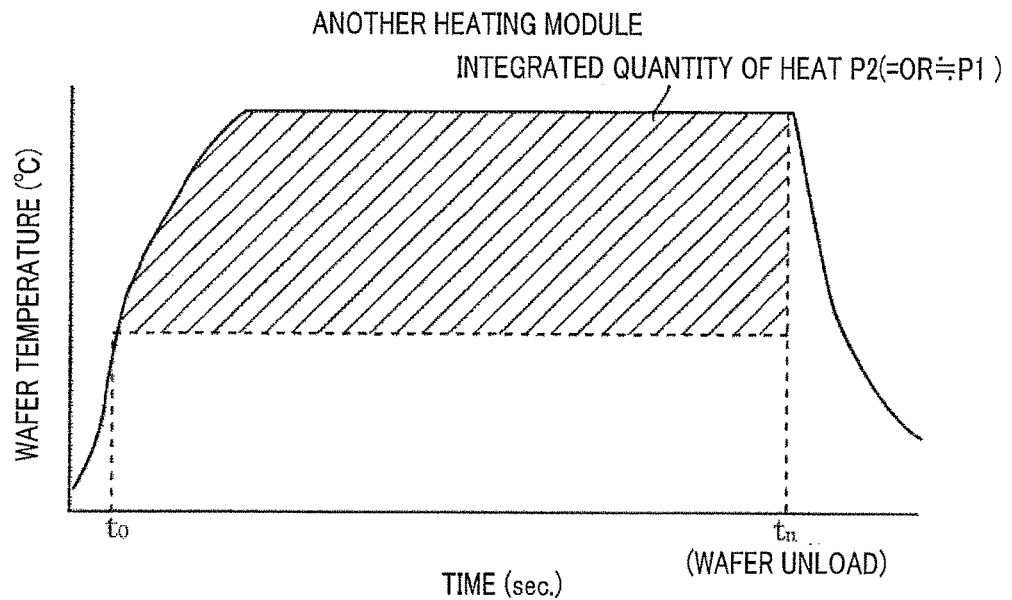
FIG. 14 is a graph showing a temperature transition profile obtained by using the processing offset values.

FIG. 14 shows a temperature transition profile of one of the channels of another heating module 2 obtained by the adjustment wafer W1, which is heated by said another heating module 2, which has been subjected to the adjusting process comprising the aforementioned steps S1 to S7. In FIG. 14, the zone corresponding to an integrated quantity of heat from the time point "t0" to the time point "tn" is labelled "P2". For the sake of convenience, the area P2 is referred to as an integrated quantity of heat P2. As described above, offset values are set by the respective heating modules 2 such that the integrated quantities of heat P1 and P2 are identical to each other. More specifically, assuming that the average of the integrated quantities of heat P1 and P2 is regarded as a reference integrated quantity of heat, it is preferable that the deviation of each integrated quantity of heat (P1, P2) from the reference integrated quantity of heat is not greater than 0.5 percent of the reference integrated quantity of heat, more preferably not greater than 0.2 percent of the reference integrated quantity of heat. The reference integrated quantity of heat may be a value that is preset beforehand irrespectively of P1 and P2.

In the foregoing coating and developing apparatus 1 having the plurality of heating modules 2 that perform PEB (Post Exposure Bake), integrated quantities of heat of the heated zones of one wafer W respectively corresponding to the plurality of heaters 3 are substantially identical in each heating module 2 and are substantially identical among the plurality of heating modules 2. Thus, it is possible to perform a heating process providing excellent in-plane uniformity of one wafer W and excellent inter-plane uniformity of wafers W.

The unit block E2 of the above coating and developing apparatus 1 has substantially the same structure as that of the unit block E3, except that a resist coating module is disposed in place of the developing module 14. A wafer W coated with a resist liquid in the resist coating module is transferred to one of the heating modules of the unit block E2 and subjected to a heating process, so that the coated resist liquid dries to form a resist film. By subjecting the plurality of heating modules in the unit block E2 to the aforementioned heating plate adjusting process, the resist film can be formed with excellent in-plane uniformity in one wafer W and excellent inter-plane uniformity among wafers W, whereby the CD uniformity can be improved in a wafer W and among wafers W. In addition, the unit block E1 has substantially the same structure as the unit block E2, except that a chemical liquid coating module for forming an antireflection film is provided in place of the resist coating module. The plurality of heating modules in the unit block E1 may be similarly subjected to the heating plate adjusting process.

In the aforementioned adjusting process, offset values are firstly obtained in steps succeeding to the step S2. For example, it is assumed that the above step S1 has been performed, and that offset values have been already set by a method comprising steps which are different from the steps succeeding to the step S2, wherein the offset values are determined such that temperatures at respective time points (after a time point at which the temperature of the wafer W rises to reach a temperature of, e.g., 55° C.) are identical among the channels. In this case, in the steps succeeding to the step S2, an increased or decreased amount of the already set offset value may be calculated. In addition, in the above steps S3 and S5, averages of integrated quantities of heat of the channels in the respective time sections "Δt" are calculated and the average is used as a reference value. However, a preset value may be used as a reference value.

In the heating module 2, one temperature sensor 4 is assigned to one heater 3 (one channel) to control heat generation of the heater 3. However, a plurality of the temperature sensors 4 may be assigned to one heater 3 (one channel) so that heat generation of the heater 3 is controlled based on the average of outputs of the temperature sensors 4.

In order to more precisely uniformize integrated quantities of heat in a plane of a wafer W, the step S5 may be repeated a plurality of times. Specifically, the secondary-performed step S5 may be performed by using offset values obtained in the firstly-performed step S5 so as to obtain new offset values. If the step 5 is performed three times, the offset values obtained in the secondly-performed step S5 are used. Namely, the (new) step S5 is performed by using offset values calculated in the previous step S5.

In the aforementioned step S6, after the adjustment wafer W1 is placed on the heating plate 23, integrated quantities of heat of the respective heated zones are calculated from a preset time point, for example, from a time point at which the temperature of the adjustment wafer W1 reaches a certain temperature such as a process temperature, to a time point at which the adjustment wafer W1 is removed from the heating plate 23. Herein, the time point "at which the adjustment wafer W1 is removed from the heating plate 23" is not limited to the exact time point at which the adjustment wafer W1 is just removed from the heating plate 23. The aforementioned time point may be a time point that is a little earlier than the exact time point at which the adjustment wafer W1 is removed from the heating plate 23, as long as the object of uniformizing the integrated quantities of heat can be achieved.

In the step S7, the judgment of appropriateness of processing offset values is made by obtaining and using temperature transition profiles. However, not limited thereto, a wafer W having an exposed resist film formed thereon is heated and developed to form a pattern, for example, and the CD of the pattern is measured. The appropriateness of processing offset values can be judged by judging whether the CD is acceptable or not.

<Evaluation Tests>

Herebelow, evaluation tests related to the present invention are described.

<Evaluation Test 1>

A process as described above was performed by using the coating and developing apparatus 1 to form resist patterns on a plurality of wafers W. In this process, the heating modules 2 performed the process under the condition that integrated quantities of heat, from the aforementioned time point "tm" to the time point "tn", of the respective wafers W were different from one another. The CD of the resist patterns of the respective wafers W were measured to calculate the average CD, and the relationship between the average CD and the integrated quantities of heat was examined.

Figure 15:
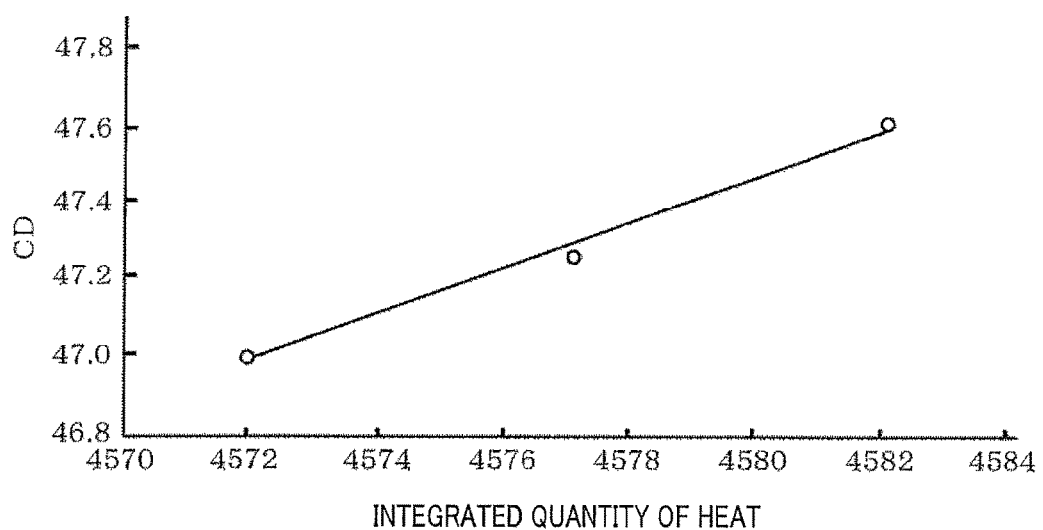
FIG. 15 is a graph showing a result of an evaluation test.

Plots in the graph of FIG. 15 show the result of the evaluation test 1. In the graph, the vertical axis and the horizontal axis indicate the average CD and the integrated quantities of heat, respectively. An approximate straight line was obtained from the plots to calculate a determination coefficient "$R^2$". Since the determination coefficient "$R^2$" was 0.9894, it was confirmed that there is a high correlation between the integrated quantity of heat from the time point "tm" to the time point "tn" and the CD of the resist pattern. Thus, by correcting offset values based on the integrated quantities of heat as described in the above step S6, it can be understood that the CD can be substantially uniformized among the heating modules 2.

<Evaluation Test 2>

An evaluation test 2-1 was conducted, in which the heating-plate adjusting process described in connection with the above embodiment was performed. Thereafter, the adjustment wafer W1 was heated by the adjusted heating plate 23, and temperature transition profiles were obtained. Integrated quantities of heat from the time point "t0" to the time point "tn" of the respective channels were calculated. An evaluation test 2-2 was conducted, in which the step S1 was performed, and offset values were set such that temperatures at respective time points after a time point at which the temperature of a wafer W rises to reach a predetermined temperature were identical among the channels. Namely, in the evaluation test 2-2, the offset values were set without obtaining integrated quantities of heat of the respective channels in the respective time sections "Δt", unlike the aforementioned heating-plate adjusting process. After the offset values were set, similar to the the evaluation test 2-1, the adjustment wafer W1 was heated by the heating plate 23 that had been set, and integrated quantities of heat from the time point "t0" to the time point "tn" of the respective channels were calculated.

Figure 16:
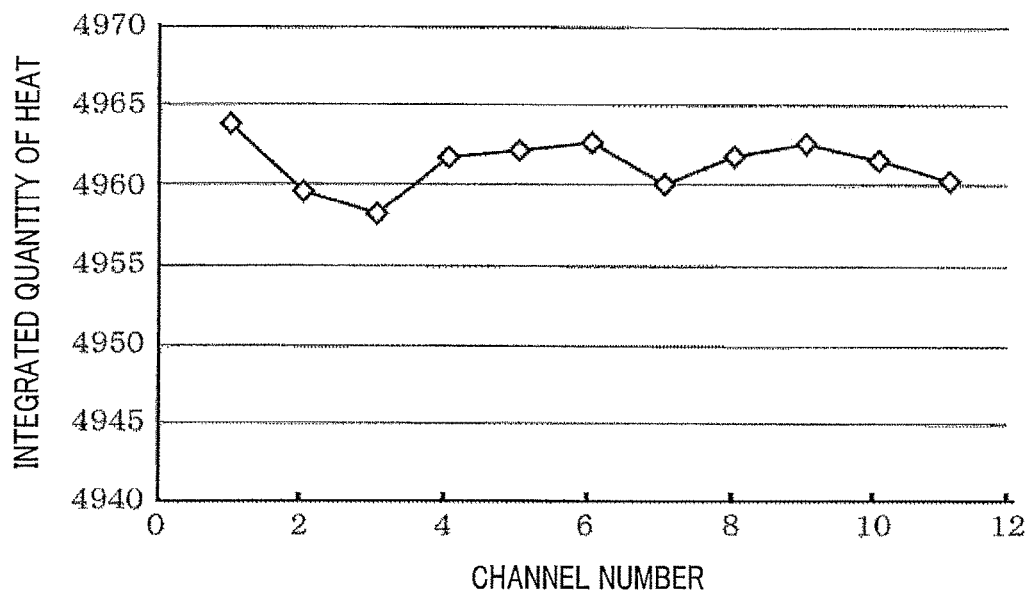
FIG. 16 is a graph showing a result of an evaluation test.
Figure 17:
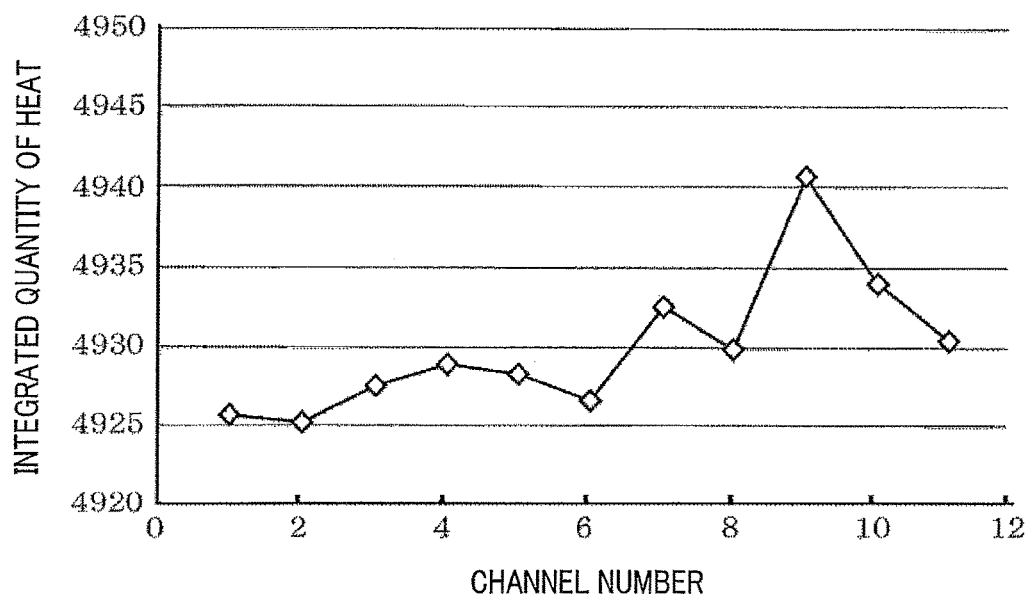
FIG. 17 is a graph showing a result of an evaluation test.

The graphs of FIGS. 16 and 17 show the results of the evaluation tests 2-1 and 2-2, respectively. The horizontal axis in each graph shows the channel numbers, and the vertical axis in each graph shows the integrated quantities of heat. In the evaluation test 2-1, the integrated quantities of heat less vary among the channels, as compared with the evaluation test 2-2. Thus, it can be presumed from the result of the evaluation test 2 that variation in the CD of a resist pattern can be more suppressed in a plane of a wafer W, by performing the aforementioned heating-plate adjusting process.

<Evaluation Test 3>

Similarly to the evaluation test 2-1, an evaluation test 3-1 was conducted, in which the heating plate adjusting process described in connection with the above embodiment was performed to set offset values. Thereafter, the adjustment wafer W1 was heated by the adjusted heating plate 23, and temperature transition profiles were obtained. Integrated values of temperatures detected from the time point "t0" to the time point "tn" were obtained from the temperature transition profiles. Further, a wafer W with an exposed resist film was subjected to PEB (Post Exposure Bake) by using the heating plate 23. Thereafter, the resist film was developed to form a resist pattern. Then, the CD of the pattern was measured at respective points in a plane of the wafer W to calculate "3σ (three times of the standard deviation)".

An evaluation test 3-2 was conducted in which offset values were set by using a method similar to the evaluation test 2-2, which is different from the method described in connection with the above embodiment. Thereafter, the adjustment wafer W1 was heated by the heating plate 23 that was adjusted like the evaluation test 3-1, and temperature transition profiles were obtained. Integrated values of temperatures detected from the time point "t0" to the time point "tn" were obtained. In addition, similar to the evaluation test 3-1, PEB was performed by using the heating plate 23, and a resist pattern was formed. Then, the CD of the pattern was measured at respective points in a plane of the wafer W to calculate "$3\sigma$".

Figure 18:
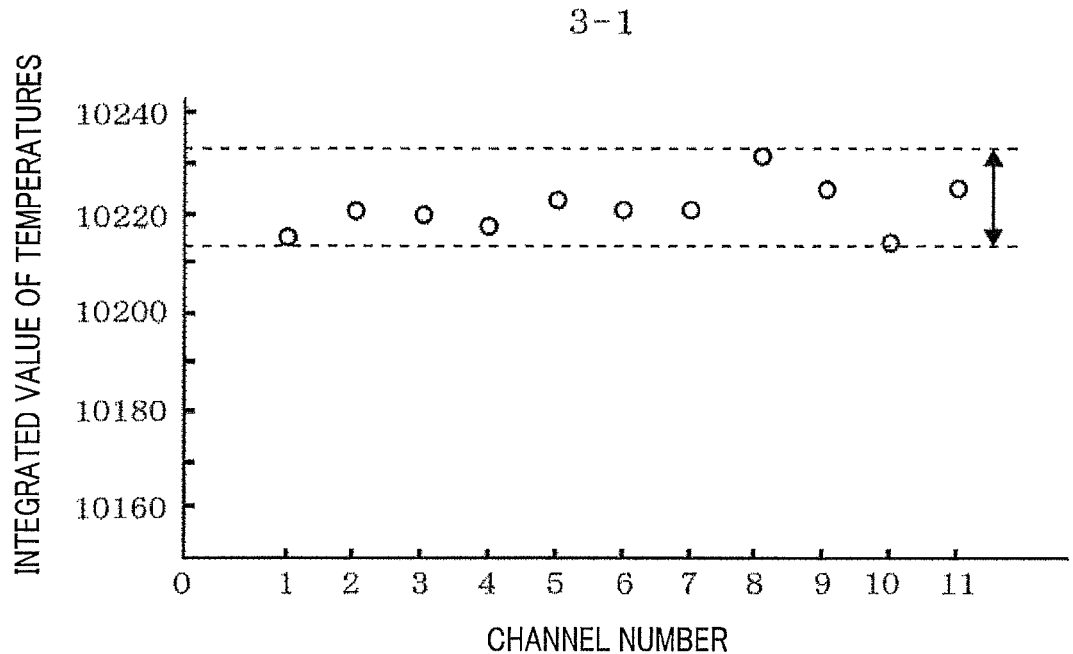
FIG. 18 is a graph showing a result of an evaluation test.
Figure 19:
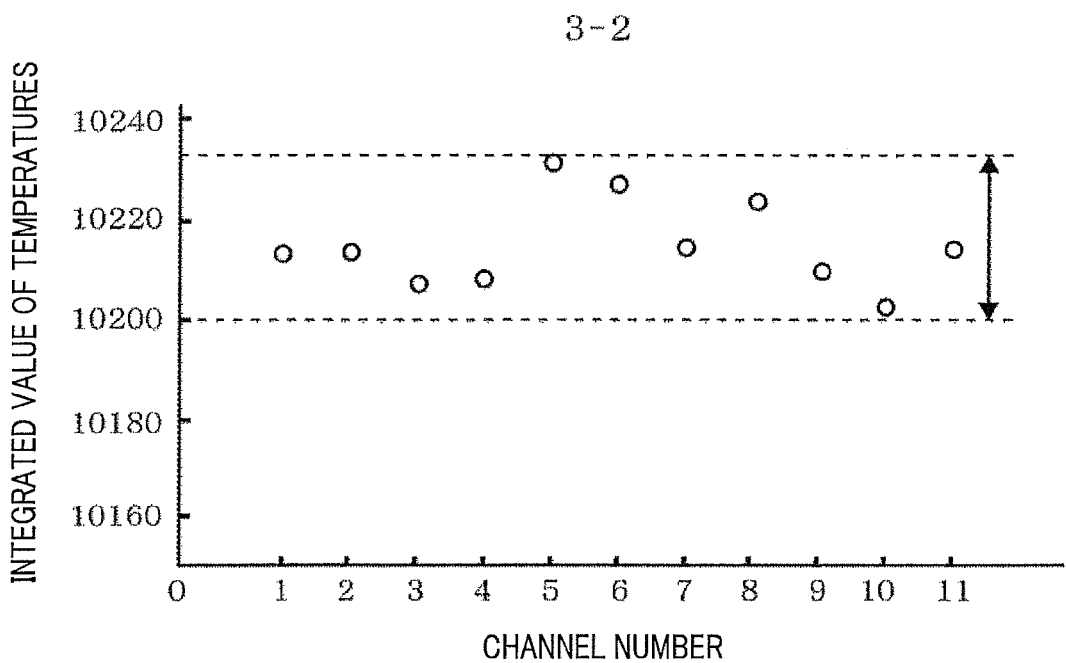
FIG. 19 is a graph showing a result of an evaluation test.

The graphs of FIGS. 18 and 19 show the results of the evaluation tests 3-1 and 3-2, respectively. The horizontal axis in each graph shows the channel numbers, and the vertical axis in each graph shows the integrated values of temperatures. As apparent from these graphs, in the evaluation test 3-1, a deviation of the integrated values of detected temperatures is smaller among the channels, as compared with the evaluation test 3-2. Thus, in the evaluation test 3-1, it is considered that a wafer W can be heated with higher in-plane uniformity. In addition, "$3\sigma$" in the evaluation test 3-1 was 0.179 nm, and "$3\sigma$." in the evaluation test 3-2 was 0.321 nm. Thus, it was confirmed from the results of "$3\sigma$", the CD variation was more suppressed in the evaluation test 3-1.

What is claimed is:

1. A substrate processing apparatus comprising:
a plurality of heating modules each including a table on which a substrate is placed to be heated, the substrate having a plurality of heated zones, the table having a plurality of heaters each assigned to heat respective ones of the heated zones, wherein heat generation of the heaters can be controlled independently from each other; and
a control unit that outputs control signals that controls the heaters such that integrated quantities of heat of the respective heated zones given by the corresponding heaters from a first time point to a second time point are substantially identical to each other in each of the heating modules, and are substantially identical to each other among the heating modules, the control unit including a target value outputting unit transmitting a signal for a target value of a temperature of each of the respective ones of the heated zones and at least one offset value outputting unit transmitting a signal for an offset value of the temperature with respect to each of the target values;
wherein the first time point is a time point at which a temperature transition profile of the substrate is rising toward a process temperature after the substrate is placed on the table under a condition where heat generation of the heaters are stable, and the second time point is a time point after the temperature transition profile reaches the process temperature,
wherein the offset value is a difference between one of the integrated quantities of heat in the respective heated zones from the first time point to the second time point and a reference value of the one of the integrated quantities of heat from the first time point to the second time point.

2. The substrate processing apparatus according to claim 1 wherein a time period from the first time point to the second time point is divided into a plurality of time sections, and wherein, in each of the time sections, the integrated quantities of heat of the respective heated zones given by the corresponding heaters are substantially identical to each other in each of the heating modules, and are substantially identical to each other among the heating modules.

3. The substrate processing apparatus according to claim 1 wherein, in each of the plurality of heating modules, the integrated quantities of heat of the heated zones are controlled such that each of the integrated quantities of heat has a deviation from a reference integrated quantity of heat not greater than 0.5 percent of the reference integrated quantity of heat.

4. The substrate processing apparatus according to claim 1 further comprising temperature detecting units that detect temperatures of respective ones of the heated zones of the substrates,
wherein the control unit further includes:
adjusting units, each adjusting unit being assigned to respective ones of the heaters, each of the adjusting units is-being configured to output a control signal that controls electric power supplied to the corresponding heater based on a deviation of a detected temperature of the corresponding temperature detecting unit from a set temperature;
adding units, each adding unit being assigned to respective ones of the heaters, each of the adding units configured to add the offset value to the target temperature, the target temperature being the process temperature, thereby to obtain the set temperature; and
a memory unit the stores the offset values, each offset value being assigned to respective ones of the heaters in respective ones of time sections.

* * * * *